US009336083B2

(12) United States Patent
Seabury et al.

(10) Patent No.: US 9,336,083 B2
(45) Date of Patent: *May 10, 2016

(54) APPARATUS AND METHODS OF PROGRAMMING MEMORY CELLS USING ADJUSTABLE CHARGE STATE LEVEL(S)

(71) Applicant: Micron Technology, Inc., Boise, ID (US)

(72) Inventors: John L. Seabury, Erie, CO (US); Bruce A. Liikanen, Berthoud, CO (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 14/632,343

(22) Filed: Feb. 26, 2015

(65) Prior Publication Data
US 2015/0169404 A1   Jun. 18, 2015

Related U.S. Application Data

(63) Continuation of application No. 13/335,291, filed on Dec. 22, 2011, now Pat. No. 8,990,644.

(51) Int. Cl.
G06F 11/00 (2006.01)
G06F 11/10 (2006.01)
G11C 29/02 (2006.01)
G06F 11/07 (2006.01)
G11C 16/00 (2006.01)

(52) U.S. Cl.
CPC .......... G06F 11/1068 (2013.01); G06F 11/076 (2013.01); G06F 11/1048 (2013.01); G11C 29/021 (2013.01); G11C 29/028 (2013.01); G11C 16/00 (2013.01)

(58) Field of Classification Search
CPC .... G11C 16/00; G11C 29/021; G11C 29/028; G06F 11/076; G06F 11/1048; G06F 11/1068
USPC .......................................... 714/704
See application file for complete search history.

(56) References Cited

U.S. PATENT DOCUMENTS

| 5,818,764 | A  | 10/1998 | Yiu et al. |
| 6,724,658 | B2 | 4/2004  | Micheloni et al. |
| 6,914,817 | B2 | 7/2005  | Harari |
| 7,154,785 | B2 | 12/2006 | Roohparvar |
| 7,466,575 | B2 | 12/2008 | Shalvi et al. |
| 7,567,464 | B2 | 7/2009  | Gendrier et al. |
| 7,573,773 | B2 | 8/2009  | Lin |

(Continued)

FOREIGN PATENT DOCUMENTS

WO   WO2008111912   9/2008

OTHER PUBLICATIONS

The International Search Report and The Written Opinion of the International Searching Authority for International Application No. PCT/US2012/071357 which is associated with U.S. Appl. No. 13/335,291, Apr. 30, 2013, Republic of Korea, submitted in parent case.

*Primary Examiner* — David Ton
(74) *Attorney, Agent, or Firm* — Pritzkau Patent Group, LLC

(57) ABSTRACT

Apparatus and methods are disclosed, including a method of programming involving determining an error rate for the memory cells, and programming the memory cells using a charge state level for a charge state that is based at least in part on the determined error rate.

16 Claims, 7 Drawing Sheets

(56) References Cited

U.S. PATENT DOCUMENTS

| | | |
|---|---|---|
| 7,715,234 B2 | 5/2010 | Aritome et al. |
| 7,730,383 B2 | 6/2010 | Visconti |
| 7,808,834 B1* | 10/2010 | Sutardja .................. 365/185.25 |
| 7,925,936 B1 | 4/2011 | Sommer |
| 7,983,082 B2 | 7/2011 | Park et al. |
| 8,103,938 B2 | 1/2012 | Guterman et al. |
| 8,296,623 B2 | 10/2012 | Cassuto et al. |
| 8,359,516 B2 | 1/2013 | Weingarten |
| 8,422,303 B2 | 4/2013 | Franca-Neto et al. |
| 8,427,875 B2 | 4/2013 | Yang |
| 2003/0137888 A1 | 7/2003 | Chen et al. |
| 2009/0103358 A1 | 4/2009 | Sommer et al. |
| 2009/0106482 A1* | 4/2009 | Sarin et al. ..................... 711/103 |
| 2010/0057977 A1* | 3/2010 | Graef ............................ 711/103 |
| 2010/0207189 A1 | 8/2010 | Kellam |
| 2010/0296350 A1 | 11/2010 | Kim et al. |
| 2011/0013460 A1 | 1/2011 | Dong et al. |
| 2011/0219274 A1 | 9/2011 | Cho et al. |
| 2011/0258495 A1 | 10/2011 | Tseng et al. |

* cited by examiner

APPARATUS AND METHODS OF PROGRAMMING MEMORY CELLS USING ADJUSTABLE CHARGE STATE LEVEL(S)

RELATED APPLICATION

This application is a continuation application of U.S. patent application Ser. No. 13/335,291 filed on Dec. 22, 2011, which matured into U.S. Pat. No. 8,990,644, issued on Mar. 24, 2015 and the disclosure of which is incorporated herein by reference.

BACKGROUND

The present application is related generally to the field of nonvolatile memory and, more particularly, apparatus and methods of programming memory cells using adjustable charge state level(s).

Non-volatile memory (NVM) is electronic data storage that does not rely on a constant power source to maintain the storage of the data. NVM can be used in memory products such as USB flash drives, SD or microSD cards, MMC or others. NAND and NOR flash memory are types of non-volatile memory. In both instances, memory cells store data in the form of different charge states.

NVM cells can be used as single level cells or multi-level cells. In a single level cell (SLC), in operation, each cell will typically be in either an erased state or a programmed state, with each of those states corresponding to a different charge state. In multi-level cells (MLC), in operation, each cell can be in an erased state, or one of multiple different programmed states, where again each of those states corresponds to a different charge state. Charging the cells to one of the programmed states to represent data can be referred to as programming the cells. In both single and multi-level cells, each of the different charge states (typically including the erased state) of the cell represents a different data value (which is sometimes referred to herein as "datum").

In NVM there are typically multiple cells arranged to be programmed together which make up a page of cells and multiple pages of cells that are arranged to be erased together which make up a block of cells. Cells are typically programmed in pages of cells and are erased in blocks of cells because of the architecture of the cells or how the cells are electrically connected. NVM cells are typically programmed by using pulses of voltage to increase the charge in the cell to a desired charge state. When a data value is programmed to the cell, pulses of charge can be applied to the cell and the charge on the cell can be read until the desired charge state representing the data value to be programmed to the cell is reached. In many instances, the cells have to be erased before programming, which can involve removing the charge from a block of cells. Programming, erasing and reading NVM cells can involve many additional electronic components such as, for example, processors, registers, buffers, and the like.

Both programming and erasing the cells can cause physical damage to the cells. Over time the damage to the cells can progress to a point where the cells are no longer usable because damaged cells are no longer reliable to store programmed data accurately. The number of times that the cells can be programmed and erased before they are too damaged and should no longer be used can be referred to as program/erase (P/E) lifetime, maximum P/E cycles of the cells or endurance.

Error correction techniques can be used to correct some degree of error when reading data from the cells. The number of errors for a given amount of data can be referred to as an error rate, which is sometimes referred to as the bit-error-rate (BER). Typically, errors up to a certain threshold error rate can be corrected using error correction techniques while errors over the threshold error rate cannot be corrected. When the errors exceed the threshold error rate for a group of cells, the cells can be considered as having reached the end of their operational lifetime.

The foregoing examples of the related art and limitations related therewith are intended to be illustrative and not exclusive. Other limitations of the related art will become apparent to those of skill in the art upon a reading of the specification and a study of the drawings.

DETAILED DESCRIPTION

The following description is presented to enable one of ordinary skill in the art to make and use the invention and is provided in the context of a patent application and its requirements. Various modifications to the described embodiments will be readily apparent to those skilled in the art and the generic principles taught herein may be applied to other embodiments. Thus, the present invention is not intended to be limited to the embodiments shown, but is to be accorded the widest scope consistent with the principles and features described herein including modifications and equivalents, as defined within the scope of the appended claims. It is noted that the drawings are not to scale and are diagrammatic in nature in a way that is thought to best illustrate features of interest. Descriptive terminology may be adopted for purposes of enhancing the reader's understanding, with respect to the various views provided in the figures, and is in no way intended as being limiting.

Figure 1:
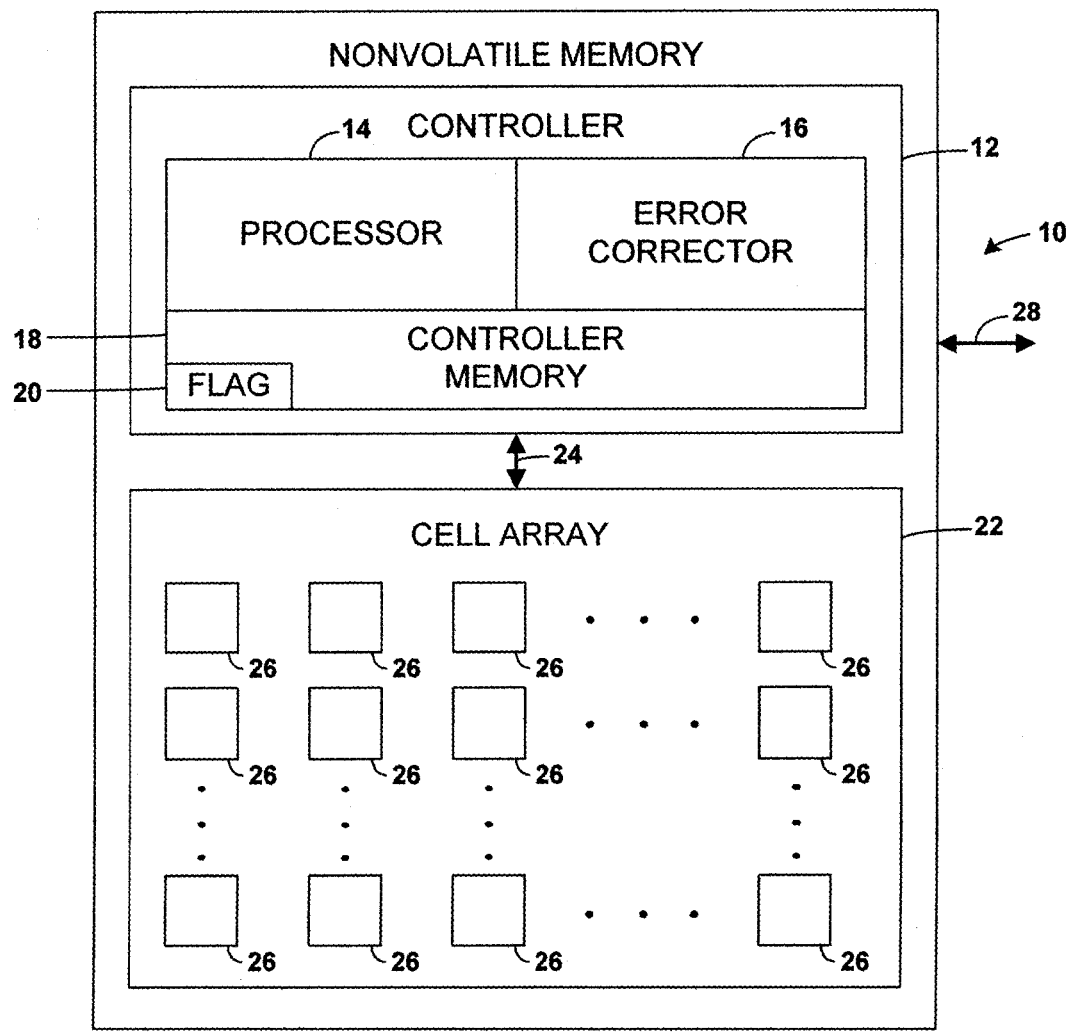
FIG. 1 is a block diagram which illustrates a non volatile memory system that is arranged according to an embodiment of the present disclosure.

Attention is now directed to the figures wherein like items may refer to like components throughout the various views. FIG. 1 is a diagrammatic representation of an apparatus, such as a non-volatile memory (NVM) system, corresponding to an embodiment of the present disclosure, and generally indicated by the reference number 10. NVM 10 includes a controller 12 which has a processor 14 and an error corrector 16. Controller includes a controller memory 18 which can store an indicator, such as a flag 20, as will be further described. Controller memory 18 can be used for storing information used during the operation of controller 12.

Controller 12 can be connected to a cell array 22 through an internal interface 24. Cell array 18 has individual cells 26 that can each be used for storing data by representing different datum with different charge states. The cells have a maximum charge state that includes the maximum amount of charge that the cells are configured to store to represent data. NVM 10 is shown with an external interface 28 which can be used for transferring data to and from the NVM.

Controller 12 can operate to control programming, reading and erasing of cells 26 in cell array 22. Controller 12 can program individual cells 26 to one of a plurality of different charge states, and can read the charge states of the individual cells to determine if the cells are programmed correctly when programming the cells and to determine the data from the cells. Error corrector 16 can be used to apply error correcting code (ECC) to data written to cells 26 and can be used to correct error in data read from cells 26 up to a certain threshold error rate. Error corrector 16 can also determine the error rate (e.g., an observed error rate) of data read from cells 26, hereafter referred to as the determined error rate. Program flag 20 can be set and reset to indicate whether the determined error rate exceeds the threshold error rate. Specific types of ECC can include but are not limited to LDPC, BCH, Reed-Solomon, trellis code modulation, and others.

Over a single or multiple program/erase cycles, greater damage can be done to the cells when the cells are programmed to a relatively higher charge state than when the cells are programmed to a relatively lower charge state. Also, greater damage can be done to the cells when the cells are erased from a relatively higher charge state than when the cells are erased from a relatively lower charge state. Over time, the damage to the cells can progress to a point where the cells are no longer reliable to accurately store data, such as where the error rate of the data read from the cells is such that the data can no longer be corrected by the ECC of error corrector 16.

Figure 2:
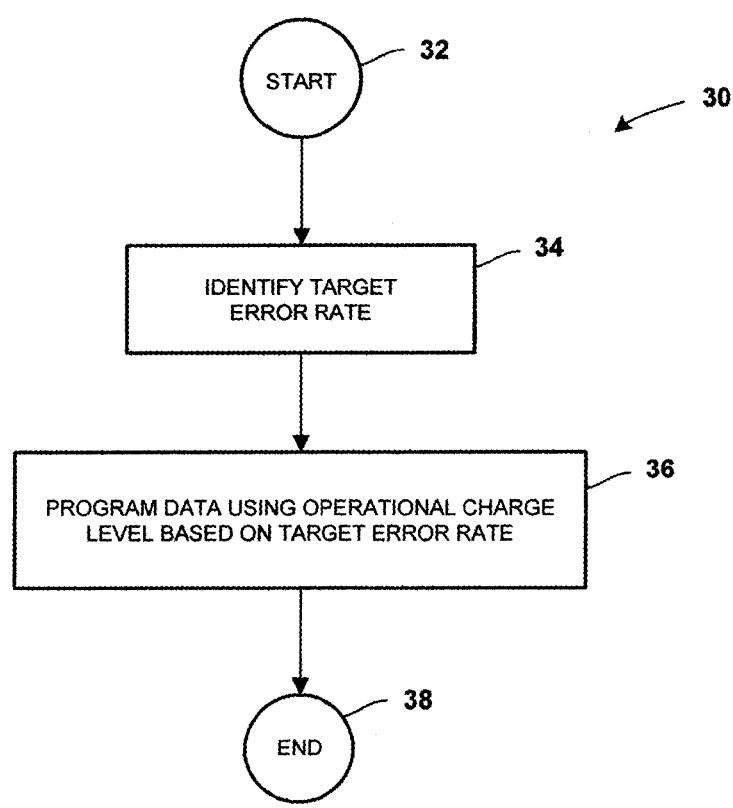
FIG. 2 is a flow diagram illustrating an embodiment of a method for the operation of the system of FIG. 1 to program cells of the memory system to include error correction information.

Referring now to FIG. 2, a method 30 for programming the data to the cells according to an embodiment of the present disclosure is illustrated. Method 30 begins at start 32 and proceeds to step 34, where a target error rate is determined (e.g., identified), such as one that is based on a tolerance of the error correcting code to errors. The target error rate can be a threshold error rate which is a maximum error rate that is correctable using the ECC in error corrector 16. The target error rate can also be an error rate that maintains the determined error rate at a safe error rate margin below the maximum error rate that is correctable using the ECC. Method 30 then proceeds to step 36 where data is programmed to the cells using a charge state level(s) for a charge state(s) that is based at least in part on the target error rate and/or the determined error rate, such as using a charge state level for an uppermost charge state that is lower than a "maximum" charge state level for that state. For example, a charge state level can be used for the uppermost charge state that corresponds to a particular range of threshold voltages, where the highest threshold voltage in that range is less than the highest threshold voltage in a range of threshold voltages corresponding to the "maximum" charge state level. Method 30 then proceeds to step 38 where the method ends.

By programming the cells using, for example, a charge state level for an uppermost charge state that is lower than the maximum charge state level, damage to the cells can be reduced. The charge state level(s) for a charge state(s) used to program data to a cell can be changed throughout the operational lifetime of the cell. Using a charge state level(s) that is relatively lower (e.g., a charge state level corresponding to a threshold voltage range having a relatively lower highest threshold voltage) should cause relatively less damage to the cells and thereafter decrease the rate at which the cells are damaged, thus increasing the operational lifetime of the cell.

There is a limit to which a charge state level can be lowered to reduce damage to the cell because there are limits on the level of charge that can be detected by the controller while still producing an error rate that can be corrected by the error corrector. A relatively lower charge state level(s) is also more likely to be influenced by damage to the cell which tends to increase the error rate. Noise on the program and read operations have a greater relative influence on the error rate when a relatively lower charge state level(s) is used.

A balance can be maintained by adjusting a charge state level(s) used to program cells (e.g., adjusting the charge state level(s) for the charge state(s) to which the cells can be programmed) to reduce damage to the cells while maintaining the error rate at no more than (e.g., below) the threshold error rate. In one embodiment, the cell can be programmed with the minimum amount of charge (e.g., using the lowest charge state level(s)) that yields an error rate that is below the threshold. In a practical application, the charge can vary slightly within a range while still being considered to be in a respective charge state level.

Figure 3:
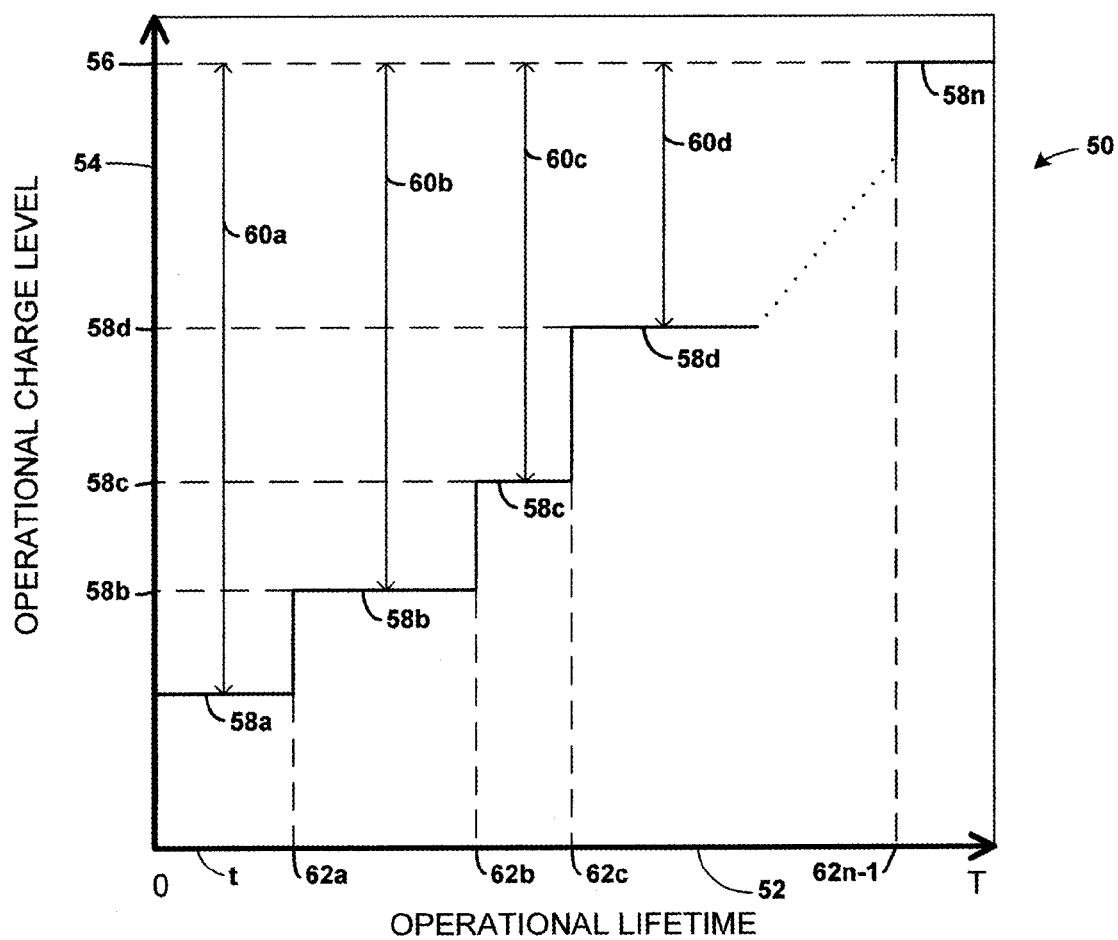
FIG. 3 is a graph illustrating different charge state levels for a particular charge state used over an operational lifetime of the cells.
Figure 5:
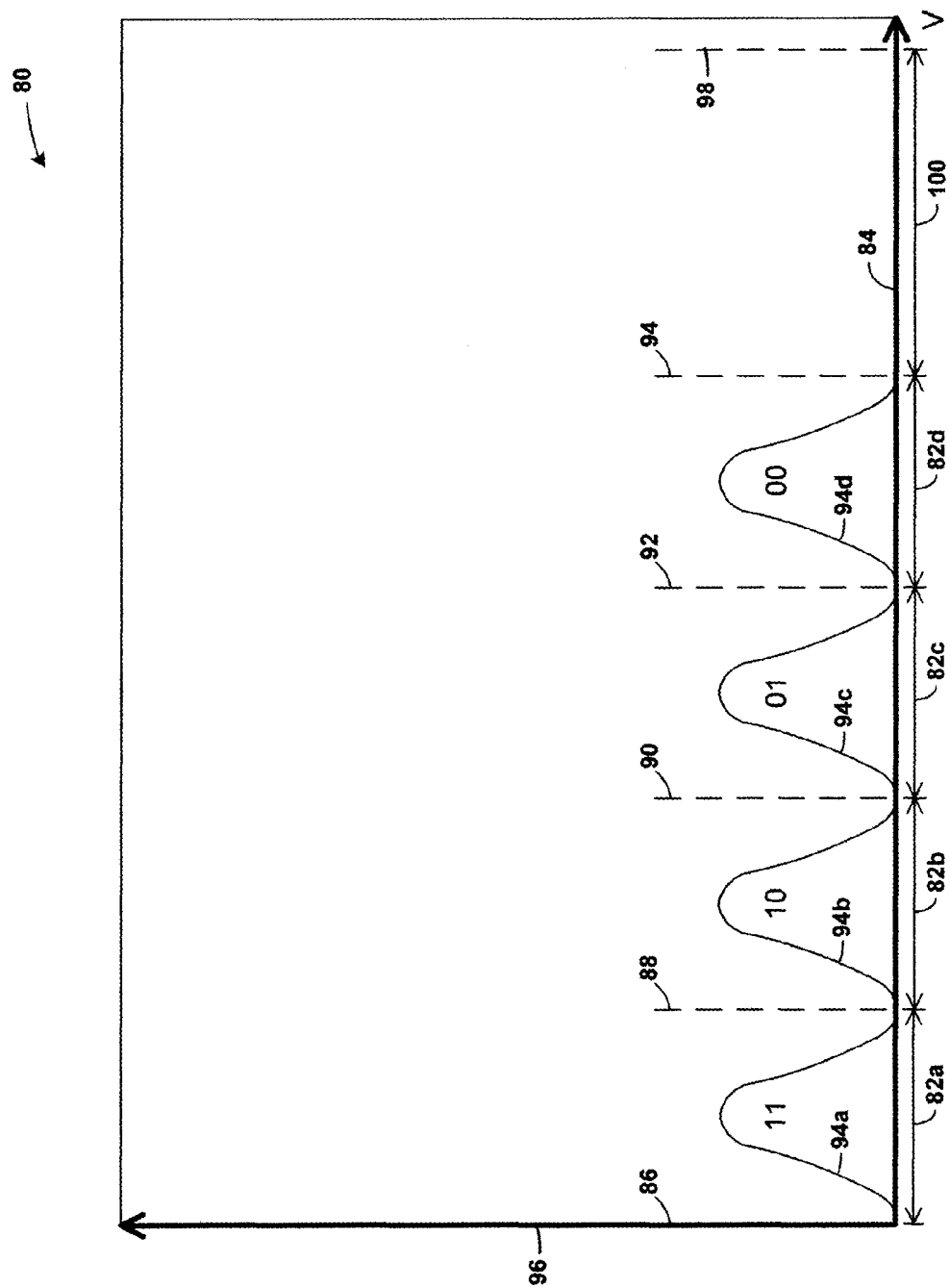
FIG. 5 is a graph illustrating a charge state distribution of a multi-level cell.

Referring now to FIG. 3 in which a graph 50 illustrates an embodiment where a charge state representing a particular data value is adjusted over time. A first axis 52 is used for illustrating time while a second axis 54 is used for illustrating potential charge state "levels" for a particular charge state used to program one or more cells. Although depicted in FIG. 3 as discrete "levels" on the second axis 54, a charge state "level" typically corresponds to a respective range of charges (e.g., corresponding to a respective range of threshold voltages), as illustrated in FIG. 5 and which is described in more detail below. Accordingly, the charge states "levels" are depicted as distinct levels on graph 50 simply as a matter of convenience. Therefore, it should be understood that, although graph 50 depicts the charge state levels as distinct levels, in practice, a charge state represented by a particular level (e.g., charge state level 58*a*) might correspond to a range of charges that partially overlaps a range of charges corresponding to another level (e.g., charge state level 58*b*).

A "maximum" charge state level 56 includes the maximum amount of charge that the cells are configured to store to represent the respective data value (e.g., it corresponds to a range of threshold voltages that has as its highest threshold voltage the highest threshold voltage that the memory cell is configured to use to store that data value). It should be appreciated that the maximum amount of charge that the cells are configured to store to represent a data value can be less than a theoretical maximum amount of charge, such as to accommodate capacity differences between cells, programming tolerances, to reduce charge coupling interference in adjacent cells and other factors. In one example embodiment, the cells can be initially programmed using a charge state level 58*a* as the uppermost charge state. Charge state level 58*a* is below the maximum charge state level 56 by a charge state level margin 60*a*. For example, a highest amount of charge corresponding to charge state level 58*a* can be below a highest amount of charge corresponding to maximum charge state level 56 by the margin 60*a*. Charge state level 58*a* can be selected by progressively increasing the charge state level used to program the cells until a determined error rate of data read from the cells is below a target error rate (e.g., the threshold error rate). The initial charge state level used during programming can be a minimum charge state level that results in the determined error rate being below the target error rate (e.g., the threshold error rate). The initial charge state level can also be determined during a self test of the memory performed during or subsequent to manufacturing of the memory. Since the charge state level(s) can be adjusted based on the determined error rate and/or a target error rate, the cells can be intelligently programmed rather than simply being programmed using a maximum charge state level(s), regardless of the error rate, as has traditionally been done.

Once the charge state level(s) is set, the controller can use that charge state level(s) for the charge state(s) representing corresponding datum in a data set. In multi-level cell applications, other charge states representing other datum in the data set can be based on the uppermost charge state. The uppermost charge state can be maintained at charge state level 58a over a period of time t, including one or more program/erase cycles until it is determined that the error rate using charge state level 58a is approaching or exceeding the target error rate (e.g., the threshold error rate), which in this instance is at time 62a, as is discussed below.

Figure 4:
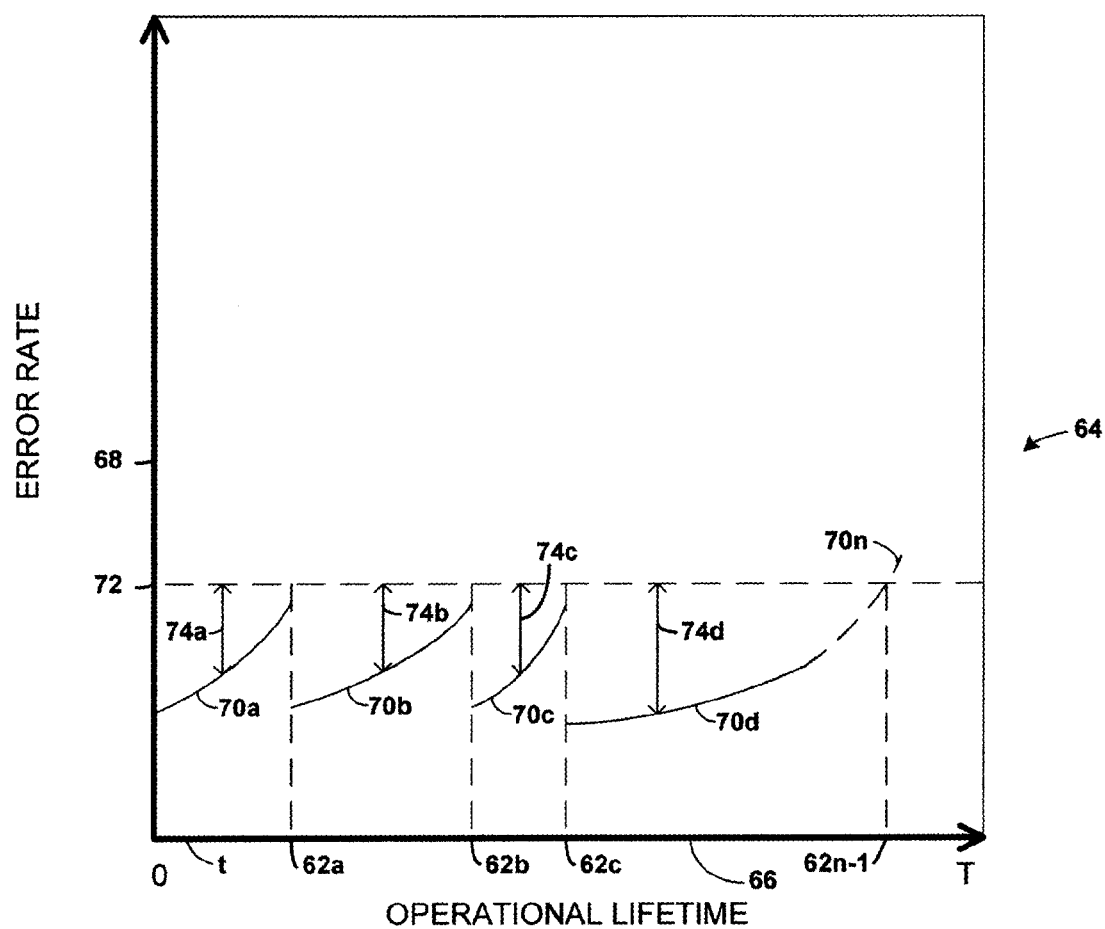
FIG. 4 is a graph illustrating different error rates which can occur over the operational lifetime of the cells.

Referring to FIG. 4 in conjunction with FIG. 3 a graph 64 illustrates time along a first axis 66 and error rate along a second axis 68. A determined error rate 70a progressively increases because of increased damage to the cells while the charge state level 58a for the uppermost charge state, for example, remains steady. A target error rate 72 can represent the threshold error rate (e.g., the maximum error rate that is correctable using error corrector 16). If the target error rate 72 is the maximum correctable error rate, the charge state level for the uppermost charge state, for example, can be adjusted to maintain the determined error rate at no more than the target error rate. An error rate margin 74a can be a difference between determined error rate 70a and target error rate 72. While the cells are programmed using charge state level 58a for the uppermost charge state, determined error rate 70a increases and error rate margin 74a decreases. At time 62a the uppermost charge state is increased to charge state level 58b, such as to prevent the determined error rate 70a from reaching or exceeding target error rate 72 (e.g., to prevent the elimination of error rate margin 74a). Increasing the uppermost charge state to charge state level 58b should yield a determined error rate 70b that is below target error rate 72 by error rate margin 74b. Method 30, shown in FIG. 2, can be used to increase the charge state level for a particular charge state, such as the uppermost charge state. Charge state level 58b is below the maximum charge state level 56 by a charge state level margin 60b.

The uppermost charge state can be increased to charge state level 58c with charge state level margin 60c at time 62b as the determined error rate 70b increases and error rate margin 74b decreases. At charge state level 58c, the determined error rate can be determined error rate 70c with error rate margin 74c. As the cells continue to age and are subjected to continued damage from P/E cycles, the uppermost charge state can then be increased to charge state level 58d at time 62c with charge state level margin 60d, determined error rate 70d and error rate margin 74d. The uppermost charge state can be progressively increased up to, for example, charge state level 58n at time 62n-1. At time 62n-1 charge state level 58n can be the maximum charge state level 56 and the determined error rate can be at determined error rate 70n which exceeds target error rate 72. It is noted that determined error rates 70a-70d may be referred to collectively by the reference number 70. Likewise, error rate margins 74a-74d may be referred to collectively using the reference number 74.

At time 62n-1, the charge state level for the respective charge state can no longer be increased to reduce the determined error rate below the target error rate so the cells can no longer be relied upon to accurately store data and the use of the cells can therefore be abandoned (particularly when the determined error rate exceeds the threshold error rate). Applicant recognizes that, as the cell or cells age and progressively become more and more damaged, a charge state level for a respective charge state can be stepwise increased and the charge state level margin stepwise decreased until the respective charge state is at the maximum charge state level with no charge state level margin and the determined error rate cannot be maintained below the threshold error rate. At this point, the cell or cells have reached an end of operational lifetime and they can be retired. It should be appreciated that even though the endurance of a memory cell can be dramatically increased through the teachings herein, deterioration is probably nevertheless unavoidable even though it may be at a remarkably slower rate.

As discussed above, the error rate of read operations of the cells even at each of the various charge state levels 58a-n of FIG. 3 can progressively increase because of damage to the cell caused by the program erase cycles over the time duration of each charge state level. Accordingly, the uppermost charge state, for example, can be set at a charge state level that yields an error rate that is sufficiently below the threshold error rate to allow an error rate margin for some limited increase in the error rate before the error rate reaches the threshold error rate. This error rate margin can define the time width of charge state levels 58a-c as seen in FIGS. 3 and 4. Error rate margin 74 between determined error rate 70 and target error rate 72 can be varied depending on whether the charge state is to be moved more or less often to maintain the determined error rate no more than the target error rate. Since the determined error rate can be used for setting the charge state level, this system does not have to just rely on statistical analysis but can take into account actual parameters related to the performance of the cells in the operation. The error rate margin can be set so that the determined error rate does not exceed the target error rate and if the determined error rate becomes close to or matches the target error rate where the data may be at risk, then the charge state level for a particular charge state can be increased. An indication (e.g., a value such as a magnitude(s)) of the charge state level for a particular charge state can be stored in controller memory 18 for groups of cells such as pages. Controller memory 18 can also be used for storing charge state level margin, maximum charge state level, target error rate, determined error rate, error rate margin and other information used by the controller for one or more groups of cells. It should be understood that these values and/or other information can also be stored in the cell array itself or in another memory as would be understood by one of ordinary skill in the art.

In a multi-level cell arrangement with a data set of multiple datum values represented by respective multiple charge states, adjusting a charge state level for a charge state (e.g., the uppermost charge state) representing a data value of the data set can include setting a charge state level to the lowest charge state level that yields a determined error rate for all of the charge states in the data set that is below the threshold error rate. The level of the uppermost charge state can be set with a margin between that level and the maximum charge state level of the cell that allows for an increase in the charge state level over the operational lifetime of the cell.

Referring now to FIG. 5, charge state distribution for multi-level cells and their corresponding data values is shown. Multi-level cell charge state distribution 80 includes four different charge state ranges 82a, 82b, 82c and 82d along a charge state axis 84. The charge state ranges can each have minimum and maximum charge states that define the outer limits of the ranges used to represent data values. These minimum and maximum charge states can also be referred to as thresholds. Charge state range 82a has a lower threshold 86 and an upper threshold 88 which can also serve as a lower threshold for charge state range 82b. Charge state range 82b has an upper threshold 90 which can also serve as a lower threshold for charge state range 82c. Charge state range 82c has an upper threshold 92 which can also serve as a lower threshold for charge state range 82d. Charge state range 82d has an upper threshold 94. Charge distributions 94a, 94b, 94c and 94d represent potential charge states for one or more multi-level cells within charge state ranges 82a, 82b, 82c and 82d, respectively. The charge distributions are shown with a frequency of occurrence axis 96 showing a number of instances of charge state plotted against the charge state level on the charge state axis 84.

As shown in multi-level cell charge distribution 80, charge state range 82a can represent a datum value "11"; charge state range 82b can represent a datum value "10"; charge state range 82c can represent a datum value "01"; and charge state range 82d can represent a datum value "00". Other multi-level cells can have more or less charge state ranges to represent more or less datum values and other data values can be assigned to the charge ranges as well. At a given time, the multi-level cell can be programmed with one of the charge states within one of the charge state ranges to represent one of the datum values.

In the example embodiment shown in FIG. 5, the cell can be programmed using upper threshold 94 as the uppermost charge state. A maximum charge state level 98 is representative of a maximum charge state level capability of the cell. Upper threshold 94 is at a lower charge state level than maximum charge state level 98 by a charge state level margin 100. Since upper threshold 94 is lower than the maximum charge state level, the upper threshold can be progressively increased over the operational lifetime of the multi-level cell until the upper threshold is at the maximum charge state level. When the upper threshold has been increased to the maximum charge state level and the error rate produced by the cell exceeds the error correcting capacity of the error corrector, the cell can be retired. As can be understood by FIG. 5, as upper threshold 94 is increased, thresholds 88, 90 and 92 can also be increased to effectively increase ranges 82a, 82b and 82c as well as range 82d which can decrease the error rate of the cell.

Figure 6:
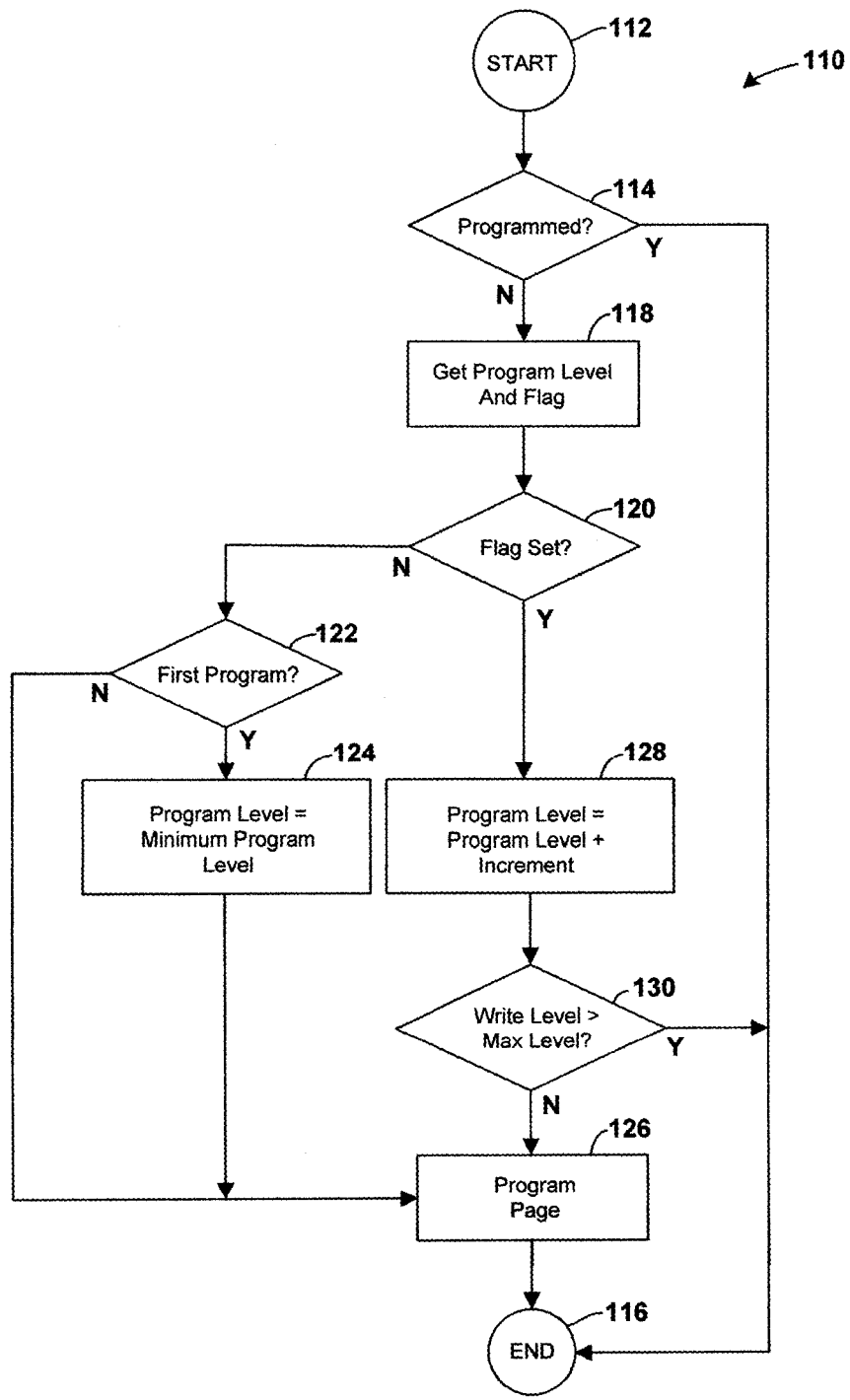
FIG. 6 is a flow diagram illustrating an embodiment of another method for operation of the system of FIG. 1 to program cells of the memory system.

Referring now to FIG. 6, a method 110 for programming data to a page of cells according to an embodiment of the present disclosure is illustrated. Method 110 is not limited to programming data to a page of cells but can be used for programming more or less than a page of cells. Method 110 begins at start 112 and proceeds to step 114 where a determination is made as to whether the page has already been programmed or is in an erased state. If the determination at 114 is that the page has been programmed, then method 110 proceeds to step 116 where the method ends. If the determination at 114 is that the page has not been programmed, then method 110 proceeds to step 118 where an indication of a charge state level and program flag 20 (FIG. 1) are retrieved. The program flag can be used to indicate whether the determined error rate exceeds or is approaching the target error rate which indicates whether the charge state level should be increased, such as to reduce the determined error rate. The program flag can be set or reset depending on whether the determined error rate is approaching or exceeds the target error rate, as will be further discussed with respect to FIG. 7. The charge state level and program flag values can be page specific in this embodiment. From step 118, method 110 proceeds to step 120 where a determination is made as to whether the program flag is set. The value of the program flag is used to determine if the present charge state level is to be used for purposes of programming the current page. If the program flag is not set, then the charge state level does not need to be increased and the existing charge state level is to be used for the next programming operation. If the determination at step 120 is that the flag is not set, then method 110 proceeds to step 122 where a determination is made as to whether the next programming operation will be the first one on the current page such that no prior value for the charge state level is available. Such a prior value will be available if the current page was previously programmed and subsequently erased.

If the next programming operation will be the first one on the current page, method 110 proceeds to step 124 where the charge state level is first initialized. Initializing can be performed, for example, by setting the charge state level to a minimum charge state level. The minimum charge state level can be the charge state level that is determined to be the minimum which may be used to program the cells in the page via method 30 (FIG. 2) and which can be stored in controller memory 18. Following step 124, method 110 proceeds to step 126 where the memory cells of the page are programmed based on the charge state level set at step 124. Method 110 then proceeds to step 116 where the method ends. If the determination at step 122 is that the next programming operation is not the first programming on the current page, then method 110 proceeds to step 126 where the page is programmed using the existing charge state level retrieved from controller memory 18. Method 110 then proceeds to step 116 where the method ends.

If the determination at step 120 is that the program flag has been set, then method 110 proceeds to step 128 where a new charge state level can be obtained by adding a charge state level increment to the existing charge state level. Method 110 then proceeds to step 130 where a decision is made as to whether the new charge state level exceeds the maximum charge state level of the cells in the page. If the determination at step 130 is that the charge state level does exceed the maximum charge state level, then method 110 proceeds to end at step 116 without programming the page. At this point, it is presumed that the current page is no longer suitable for programming and would normally be designated to be retired from further use by the memory system. If the determination at step 130 is that the charge state level does not exceed the maximum charge state level, then method 110 proceeds to step 126 where the new charge state level is used to program the page. Method 110 then ends at step 116.

Figure 7:
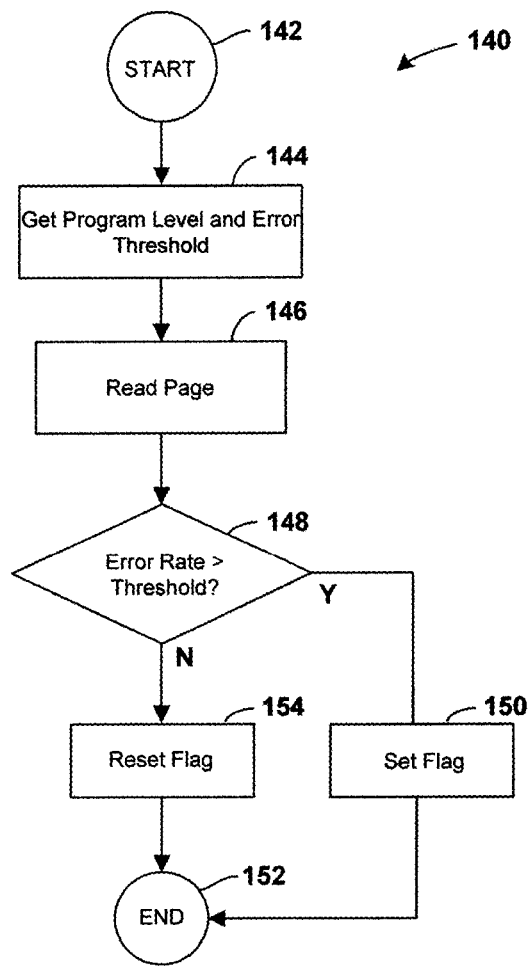
FIG. 7 is a flow diagram illustrating an embodiment of a method for operation of the system of FIG. 1 to read data from the cells of the memory system.

Referring now to FIG. 7, a method 140 for reading data from a page according to an embodiment of the present disclosure is illustrated. Method 140 begins at start 142 and proceeds to step 144 where the charge state level and target error rate are obtained for the present page from controller memory 18. Method 140 then proceeds to step 146 where the page data is retrieved by reading the page and an error rate is determined using the error corrector. Method 140 then proceeds to step 148 where a determination is made as to whether the determined error rate exceeds the target error rate. If the determination at step 148 is that the determined error rate exceeds the target error rate, then method 140 proceeds to step 150 where the program flag is set. Method 140 then proceeds to step 152 where the method ends. If the determination at step 148 is that the determined error rate does not exceed the target error rate, then method 140 proceeds to step 154 where the program flag is reset. Following step 154, method 140 proceeds to step 152 where the method ends. It should be understood that setting and/or resetting of the program flag may involve an average of determined error rates obtained over several successive reads. By averaging, the decision to increase (e.g., increment) the charge state level may minimize or reduce the influence of individual reads of the page. The value of the program flag after a read operation in method 140 (FIG. 7) can constitute a major part of the decision concerning whether to increase the charge state level for subsequent programming operations on a page in method 110 (FIG. 6). Other suitable units of data can be read and programmed; the present technique is not limited to a page.

Typically, the cells are erased prior to programming by setting the charge in the cells to an erased state (e.g., removing charge). In many memory arrangements, erasing is performed on a block of cells at a time. Erasing can be a time consuming operation and the time that it takes to erase a block can depend at least partially on the charge state level(s) used to program the cells prior to erasing. Cells programmed using relatively higher charge state levels take longer to erase than cells programmed using relatively lower charge state levels. Erasing cells from a relatively higher charge state level is also likely to cause more damage to the cells than erasing from a relatively lower charge state level. However as discussed, there is a point at which lowering the charge state level(s) can cause read operations to exhibit an error rate that is higher than the threshold error rate. In some instances, it can be of benefit to minimize the erase time. In these instances, the charge state level(s) can be selected to reduce the erase time while still maintaining the error rate determined by read operations below the target error rate.

Nonvolatile memory cells can be used for relatively longer term storage or relatively shorter term storage. Accommodations can be made for data retention in the cells in applications involving longer term storage where a reduced charge state level(s) is used for a charge state(s). Data retention relates to maintaining an accurate representation of the data in the cell over a period of time. Several situations can affect data retention, such as read disturb, write disturb, charge leakage and others which tend to degrade the cell or the cell charge over time as are well known to those having ordinary skill in the art. One way to accommodate data retention for longer term storage is to set a relatively higher error rate margin between the determined error rate and the threshold error rate. The relatively higher error rate margin can be set greater than an error rate margin used for relatively shorter term storage, such as memory used as a cache. By having a relatively higher error rate margin, the charge state level(s) in the cells can change slightly during the lifetime of longer term data stored in the memory while still producing an error rate that is less than the threshold error rate. On the other hand, cells used for relatively shorter term data storage can utilize a relatively smaller error rate margin since accurate data retention over a long term is not a major consideration. A relatively smaller error rate margin allows for the use of a lower charge state level(s) which can increase the operational lifetime of the memory.

The foregoing description of the invention has been presented for purposes of illustration and description. It is not intended to be exhaustive or to limit the invention to the precise form or forms disclosed, and other modifications and variations may be possible in light of the above teachings wherein those of skill in the art will recognize certain modifications, permutations, additions and sub-combinations thereof.

What is claimed is:

1. A method for programming memory cells, the method comprising:

error correcting data in the memory cells with an error correcting code that exhibits a tolerance to errors in the data such that the errors are correctable up to a threshold error rate;

determining an observed error rate for the memory cells; and programming data to the memory cells using a charge state level that is based at least in part on a relationship between the threshold error rate and the determined observed error rate such that the charge state level is at least approximately equal to a minimum charge state level that yields the determined observed error rate as no greater than the threshold error rate.

2. The method of claim 1 further comprising:

adjusting the charge state level to prevent the determined observed error rate from exceeding the threshold error rate.

3. An apparatus comprising:

an error corrector for determining an observed error rate of data programmed to memory cells and for correcting errors in the data with an error correcting code that exhibits a tolerance to errors in the data such that the errors are correctable up to a threshold error rate; and a controller operable to program the memory cells using a charge state level that is based at least in part on a relationship between the threshold error rate and the determined observed error rate such that the charge state level is at least approximately equal to a minimum charge state level that yields the determined observed error rate as no greater than the threshold error rate.

4. The apparatus of claim 3 wherein a difference between the determined observed error rate and the threshold error rate is an error rate margin and the charge state level is selected based at least in part on maintaining at least a minimum error rate margin.

5. A method for programming memory cells over an operational lifetime based on deterioration of the memory cells responsive to aging, the method comprising:

for representing a given data state, programming data to the memory cells over the operational lifetime thereof using a series of charge state levels having an amount of charge that increases stepwise from one charge state level to the next as the memory cells age.

6. The method of claim 5 further comprising:

retiring the memory cells responsive to a current one of the series of charge state levels reaching a maximum charge state level that is associated with the memory cells.

7. The method of claim 5 wherein each charge state level is based at least in part on a relationship between a threshold error rate of an error correcting code and a determined observed error rate of data programmed to the memory cells such that each charge state level is at least approximately equal to a minimum charge state level that yields the determined observed error rate as no greater than the threshold error rate.

8. The method of claim 5 wherein the given data state corresponds to an uppermost charge state of a set of data states.

9. The method of claim 8 wherein the set of data states is spaced across a range of charge having the uppermost charge state as an upper limit and wherein a data state charge level for each of the data states in the set of data states is stepwise increased responsive to each stepwise increase in the charge state level for the given data state.

10. The method of claim 9 wherein a data state charge range for each of the data states is stepwise increased responsive to each stepwise increase in the charge state level for the given data state.

11. An apparatus for programming memory cells over an operational lifetime based on deterioration of the memory cells responsive to aging, the apparatus comprising:

for representing a given data state, a programmer for programming data to the memory cells over the operational lifetime thereof using a series of charge state levels having an amount of charge that increases stepwise from one charge state level to the next as the memory cells age.

12. The apparatus of claim 11 wherein the programmer is configured for retiring the memory cells responsive to a current one of the series of charge state levels reaching a maximum charge state level that is associated with the memory cells.

13. The apparatus of claim 11 wherein each charge state level is based at least in part on a relationship between a threshold error rate of an error correcting code and a determined observed error rate of data programmed to the memory cells such that each charge state level is at least approximately equal to a minimum charge state level that yields the determined observed error rate as no greater than the threshold error rate.

14. The apparatus of claim 11 wherein the given data state corresponds to an uppermost charge state of a set of data states.

15. The apparatus of claim 14 wherein the set of data states is spaced across a range of charge having the uppermost charge state as an upper limit and wherein the programmer is configured such that a data state charge level for each of the data states in the set of data states is stepwise increased responsive to each stepwise increase in the charge state level for the given data state.

16. The apparatus of claim 15 wherein the programmer is configured such that a data state charge range for each of the data states is stepwise increased responsive to each stepwise increase in the charge state level for the given data state.

* * * * *